United States Patent
Steyskal et al.

(10) Patent No.: US 7,496,997 B2
(45) Date of Patent: Mar. 3, 2009

(54) METHOD FOR MAKING A WOUND CAPACITOR

(75) Inventors: Aaron J. Steyskal, Portland, OR (US); Tao Liu, University Place, WA (US); Steve Schiveley, Forest Grove, OR (US); Peir Chu, Portland, OR (US); Mike Greenwood, Oregon City, OR (US)

(73) Assignee: Intel Corporation, Santa Clara, CA (US)

( * ) Notice: Subject to any disclaimer, the term of this patent is extended or adjusted under 35 U.S.C. 154(b) by 95 days.

(21) Appl. No.: 11/339,918

(22) Filed: Jan. 25, 2006

(65) Prior Publication Data

US 2006/0145360 A1 Jul. 6, 2006

Related U.S. Application Data

(62) Division of application No. 10/737,467, filed on Dec. 15, 2003, now Pat. No. 7,742,702.

(51) Int. Cl.
*H01G 4/18* (2006.01)
*H01G 4/32* (2006.01)

(52) U.S. Cl. ............... 29/25.42; 29/25.03; 29/25.01; 361/303; 361/307; 361/311

(58) Field of Classification Search ............... 29/25.03, 29/25.35–25.42, 832–835; 361/301.5, 302–307, 361/311, 525, 528; 228/180.21–180.22, 228/207, 223
See application file for complete search history.

(56) References Cited

U.S. PATENT DOCUMENTS

| | | | | |
|---|---|---|---|---|
| 3,010,056 A | * | 11/1961 | Kurland et al. | 361/522 |
| 3,988,650 A | * | 10/1976 | Fritze | 361/511 |
| 5,019,418 A | * | 5/1991 | Linzey et al. | 427/79 |
| 5,359,487 A | | 10/1994 | Carrico et al. | |
| 5,676,305 A | * | 10/1997 | Potter et al. | 228/207 |
| 6,110,233 A | * | 8/2000 | O'Phelan et al. | 29/25.03 |
| 6,194,979 B1 | | 2/2001 | Bloom et al. | |
| 6,294,971 B1 | * | 9/2001 | Martich | 335/151 |
| 6,352,437 B1 | * | 3/2002 | Tate | 439/83 |
| 6,529,365 B1 | | 3/2003 | Liu et al. | |
| 6,862,784 B2 | * | 3/2005 | Liu et al. | 29/25.42 |
| 7,042,702 B2 | * | 5/2006 | Steyskal et al. | 361/301.5 |
| 7,054,136 B2 | * | 5/2006 | Ritter et al. | 361/309 |

FOREIGN PATENT DOCUMENTS

| | | |
|---|---|---|
| EP | 0 872 859 A | 10/1998 |
| EP | 1 024 509 A 1 | 8/2000 |
| JP | 60 177611 A | 9/1985 |

OTHER PUBLICATIONS

International Search Report for PCT/US2004/03929, Filing date Nov. 24, 2004, mailed Mar. 11, 2005, 6 pages.

* cited by examiner

*Primary Examiner*—Minh Trinh
(74) *Attorney, Agent, or Firm*—Blakely, Sokoloff, Taylor & Zafman LLP

(57) ABSTRACT

A wound capacitor has a lead configuration that enables enhanced control over equivalent series resistance (ESR) and equivalent series inductance (ESL). The capacitor has a case and a wound foil disposed within the case. A ball-and-lead configuration is coupled to the foil and extends from the case.

4 Claims, 4 Drawing Sheets

US 7,496,997 B2

METHOD FOR MAKING A WOUND CAPACITOR

CROSS-REFERENCE TO OTHER APPLICATIONS

This is a divisional of U.S. patent application Ser. No. 10/737,467, filed on Dec. 15, 2003. Which is U.S. Pat. No. 7,742,702, issued on May 6, 2006.

BACKGROUND OF THE INVENTION

1). Field of the Invention

The present invention generally relates to capacitors. More particularly, the invention relates to a capacitor having a reduced equivalent series resistance (ESR) and equivalent series inductance (ESL).

2). Discussion of Related Art

In the highly competitive personal computer (PC) industry, the difficult trade-off between cost and performance has been well documented. For example, in an effort to provide more features to the consumer at a lower cost, significant focus has been placed on streamlining motherboard systems and components. Most motherboards employ one or more voltage regulation circuits to ensure that the proper reference voltages are supplied to the motherboard processors, and it has been determined that such a circuit has a direct effect on the switching performance of the processor. The voltage regulation circuit typically has a voltage regulation module and a capacitor arrangement (among other components). The capacitor arrangement is critical because it provides decoupling between the voltage regulation module (VRM) and the processor. Conventional approaches to the capacitor arrangement involve the use of multiple high performance bulk-type capacitors, which can have very low temperature stability, wide frequency range, and long life. Low ESR reduces the unwanted parasitic impedance and heating effects that degrade capacitors, and is highly desirable in the computing industry. The cost of these performance capacitors, however, is relatively high with respect to other capacitors. It is therefore desirable to provide an alternative to conventional. performance capacitors in voltage regulation circuits.

The alternative approach to the above design would be to use a combination of ceramic and conventional electrolytic capacitors, which would reduce the costs of the capacitor arrangement considerably. The trade-off to reduced cost, however, is reduced performance under conventional approaches.

Thus, the conventional capacitor arrangement provides a significant cost-saving opportunity, but certain difficulties remain. For example, the typical wound aluminum electrolytic capacitor is unable to meet the exacting ESR and ESL requirements of modem day high-speed processors. FIGS. 1-3 illustrate that the conventional wound capacitor 10 has a case 12, a winding 14 disposed within the case 12 and a dual lead configuration 16. The dual lead configuration 16 is coupled to the winding 14 and extends from the case 12 for connection to an external printed wiring board (PWB, not shown). It can be seen that the dual lead configuration 16 has a cathode terminal assembly 18 and anode terminal assembly 20. Each terminal assembly 18 and 20 includes a termination 22 (22a, 22b), a lead 24 (24a, 24b), and a weld 26 (26a, 26b) coupling the termination 22 to the lead 24.

It has been determined that the design of the dual lead configuration 16 can be quite challenging with regard to ESR and ESL. For example, limiting the lead configuration to two terminal assemblies has been found to contribute to a relatively high ESR in a capacitor of this type. The distance between terminal assemblies 18 and 20 has a significant impact on ESR and ESL.

It is also important to note that the weld 26 contributes to loop ESL and that the relatively long two-piece termination/lead design adds to both loop ESL and ESR. It is therefore desirable to provide a lead configuration that enables ESR to be reduced without sacrificing with respect to ESL.

It will also be appreciated that certain manufacturing and placement difficulties can also result from the conventional capacitor 10. For example, the typical solder connection that occurs at the leads 24 requires wave soldering, which prohibits the use of the capacitor 10 in dual-sided reflow PWBs. Furthermore, the traditional case 12 can be relatively tall, which limits the use of the capacitor 10 to applications having a great deal of clearance space. Tall body and long leads contribute to higher ESR/ESL as well. Redesign of the height could bring the ESR/ESL down.

BRIEF DESCRIPTION OF THE DRAWINGS

The invention is described by way of example with reference to the accompanying drawings, wherein.

DETAILED DESCRIPTION OF THE INVENTION

A capacitor and method of fabricating a capacitor in accordance with the principles of the present invention provide enhanced performance. The capacitor has a case and a wound foil disposed within the case. A ball-and-lead configuration is coupled to the foil and extends from the case. The use of ball-and-lead technology for the lead configuration provides substantial benefits with respect to ESR, ESL, manufacturability, and placement.

In another aspect of the invention, a ball-and-lead configuration of a capacitor includes a cathode termination having a first end coupled to a first surface of a foil. An anode termination has a first end coupled to a second surface of the foil. The ball-and-lead configuration further includes two conductive solder balls, of the kind used in ball grid array technology, coupled to second ends of the terminations, where the solder balls enable electrical connection of the lead configuration to a printed wiring board (PWB).

In another aspect of the invention, a method of fabricating a capacitor is provided. A case is provided, and a ball-and-lead configuration is coupled to a foil. The method further provides for disposing the foil within the case such that the ball-and-lead configuration extends from the case.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute part of this specification. The drawings illustrate various features and embodiments of the invention, and together with the description serve to explain the principles and operation of the invention.

Figure 1:
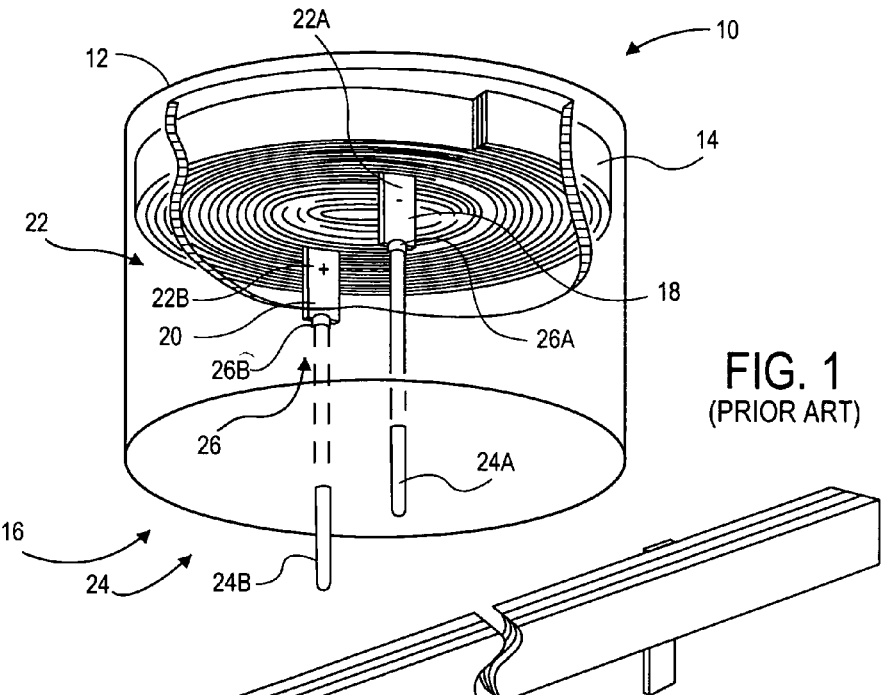
FIG. 1 is a perspective view of a conventional wound capacitor, useful in understanding the invention.
Figure 2:
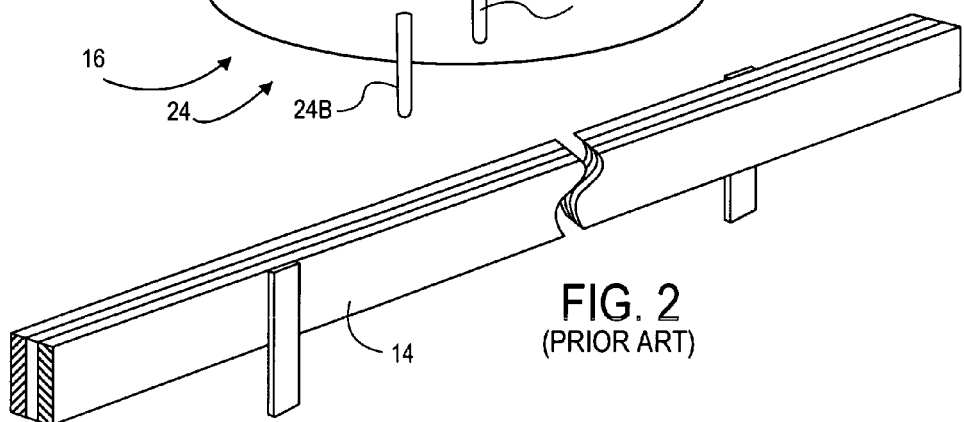
FIG. 2 is a perspective view of a first surface of a conventional foil before winding.
Figure 3:
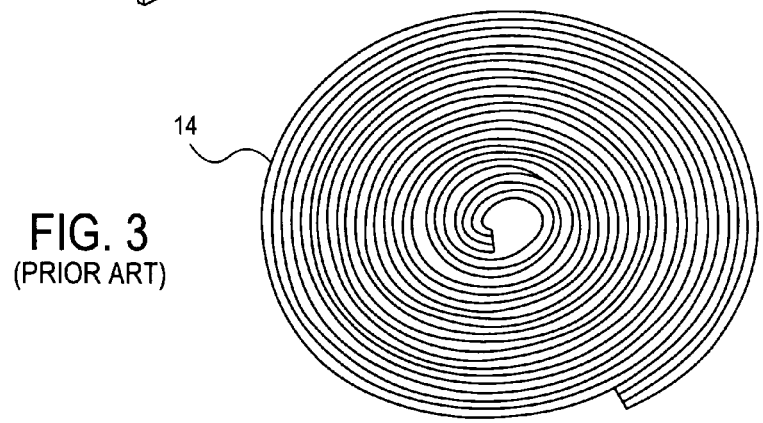
FIG. 3 is a top plan view of a conventional capacitor.
Figure 4:
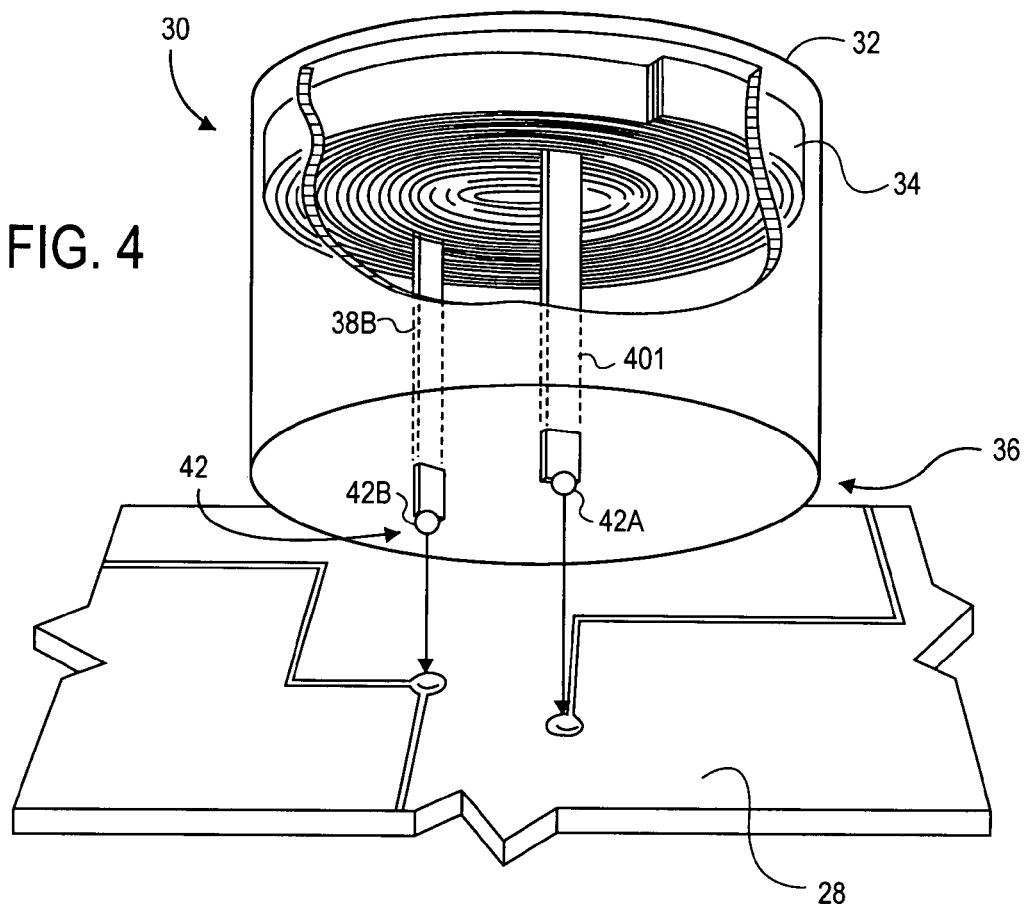
FIG. 4 is a perspective view of an electronic assembly including a printed wiring board and a capacitor in accordance with one embodiment of the present invention.

FIG. 4 shows a wound capacitor 30 having significantly improved ESL as well as enhanced manufacturability and placement flexibility. While the capacitor 30 will be primarily described with respect to a motherboard voltage regulation circuit, it is important to note that the invention is not so limited. In fact, the capacitor 30 can be beneficial to any application in which ESR, ESL, manufacturability, or placement are of concern. Notwithstanding, motherboard voltage regulation circuits have a number of aspects for which the capacitor 30 is uniquely suited.

It can generally be seen that the capacitor 30 has a case 32 and a wound foil 34 disposed within the case 32. A ball-and-lead configuration 36 is coupled to the foil 34 and extends from the case 32. The ball-and-lead configuration 36 includes one elongate flat cathode termination 38 having a first end coupled to a first surface of the foil 34. The ball-and-lead configuration 36 includes one elongate flat anode termination 40 having a first end coupled to a second surface of the foil 34. In another embodiment, the ball-and-lead configuration 36 may have a total of three, four, or five terminations. The ball-and-lead configuration 36 may have an equal number of cathode and anode terminations or may have one more of one than the other.

Figure 5:
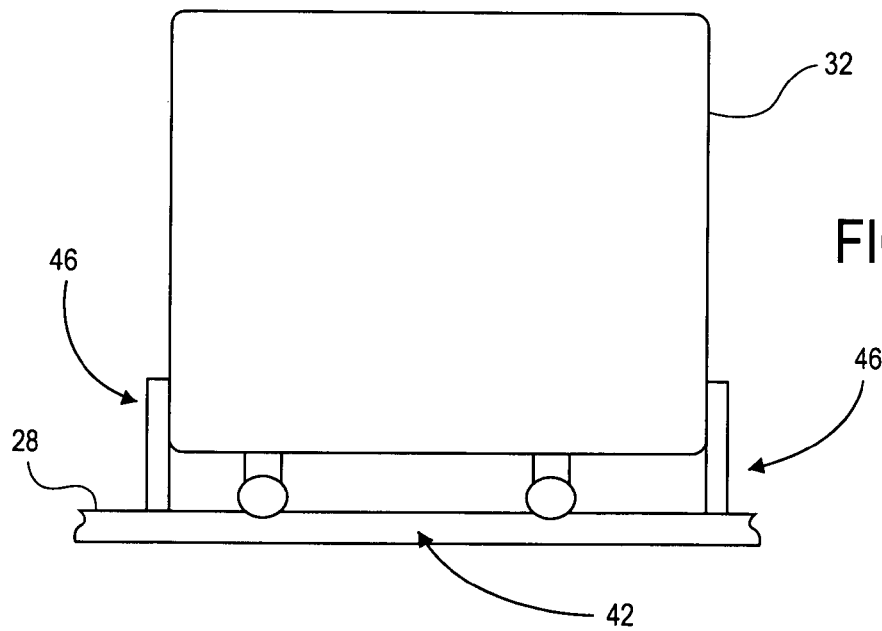
FIG. 5 is a side view of the assembly shown in FIG. 4.

As will be discussed in greater detail below, the foil 34 can be an aluminum foil of the type that is commercially available and widely used in the industry. U.S. Pat. No. 6,110,233 to O'Phelan, et al. describes one such foil, but other techniques may be used without parting from the nature and scope of the invention. It can further be seen that the ball-and-lead configuration 36 includes two solder balls 42 coupled to second ends of the terminations 38, 40, where the solder balls 42 enable electrical connection of the lead configuration to a printed wiring board 28 as best shown in FIG. 5.

Figure 7:
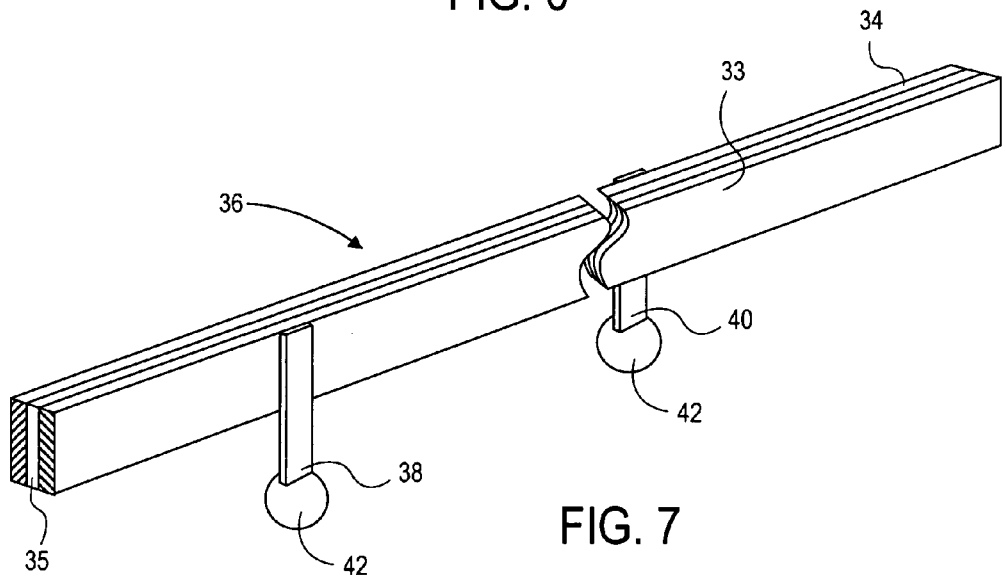
FIG. 7 is a perspective view of an example of a foil and lead configuration before winding in accordance with one embodiment of the present invention.

Turning now to FIG. 7, it can be seen that the foil 34 is made up of a first surface 33, a second surface (not shown), and a dielectric layer 35 "sandwiched" between two foil surfaces. The surfaces of the foil 34 may be electrically conductive layers that are deposited on, grown on, or otherwise attached to the dielectric layer 35. Although the terminations 38, 40 are shown as being attached to the sides of the electrically conductive layers that face outward with respect to the dielectric layer 34, the inward facing sides may also be used. Furthermore, it should be noted that the terminations 38, 40 may be coupled to either side of the foil 34, and that coupling may be accomplished by welding, soldering, swagging, electrically conductive adhesive, or any other suitable technique.

With continuing reference to FIGS. 1-7, it will be appreciated that eliminating the conventional weld further reduces loop ESL, and the shorter terminations 38,40 reduce both loop ESL and ESR.

Figure 6:
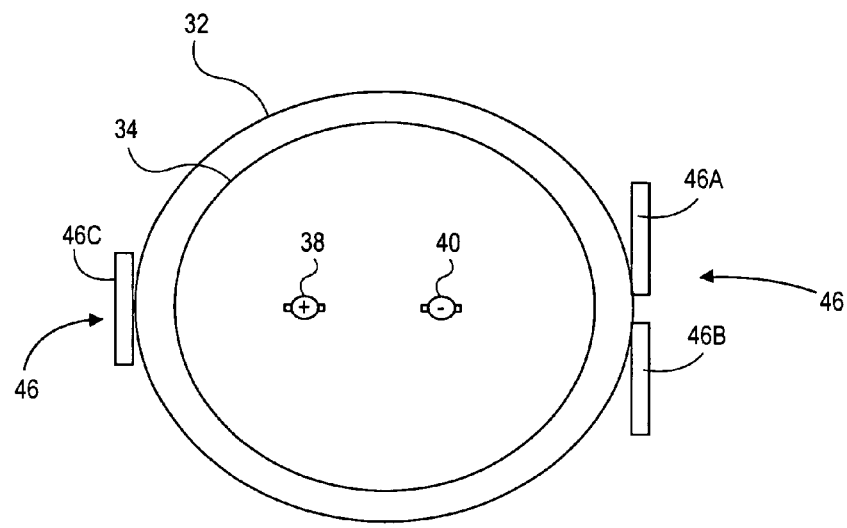
FIG. 6 is a bottom view of an example of a capacitor in accordance with one embodiment of the present invention.

Additionally, by using solder balls 42, the physical height of the capacitor is reduced, which enables the component to fit into height-constrained locations. Furthermore, the solder balls 42 enable surface mount connection of the lead configuration 36 to the PWB 28. As best shown in FIGS. 5 and 6, the case 32 includes a plurality of orientation pins 46 (46a-46c) extending from the case 32, where the orientation pins 46 facilitate assembly of the capacitor 30 to the PWB 28. Specifically, the orientation pins 46 prevent mis-orientation of the capacitor 30 during board assembly and provide improved stability as the board is soldered. In this regard, it has been determined that conventional wound capacitors can be inserted backwards, causing dramatic failures, and may require a hold-down feature to prevent wobbling as the board goes through wave soldering.

Figure 8:
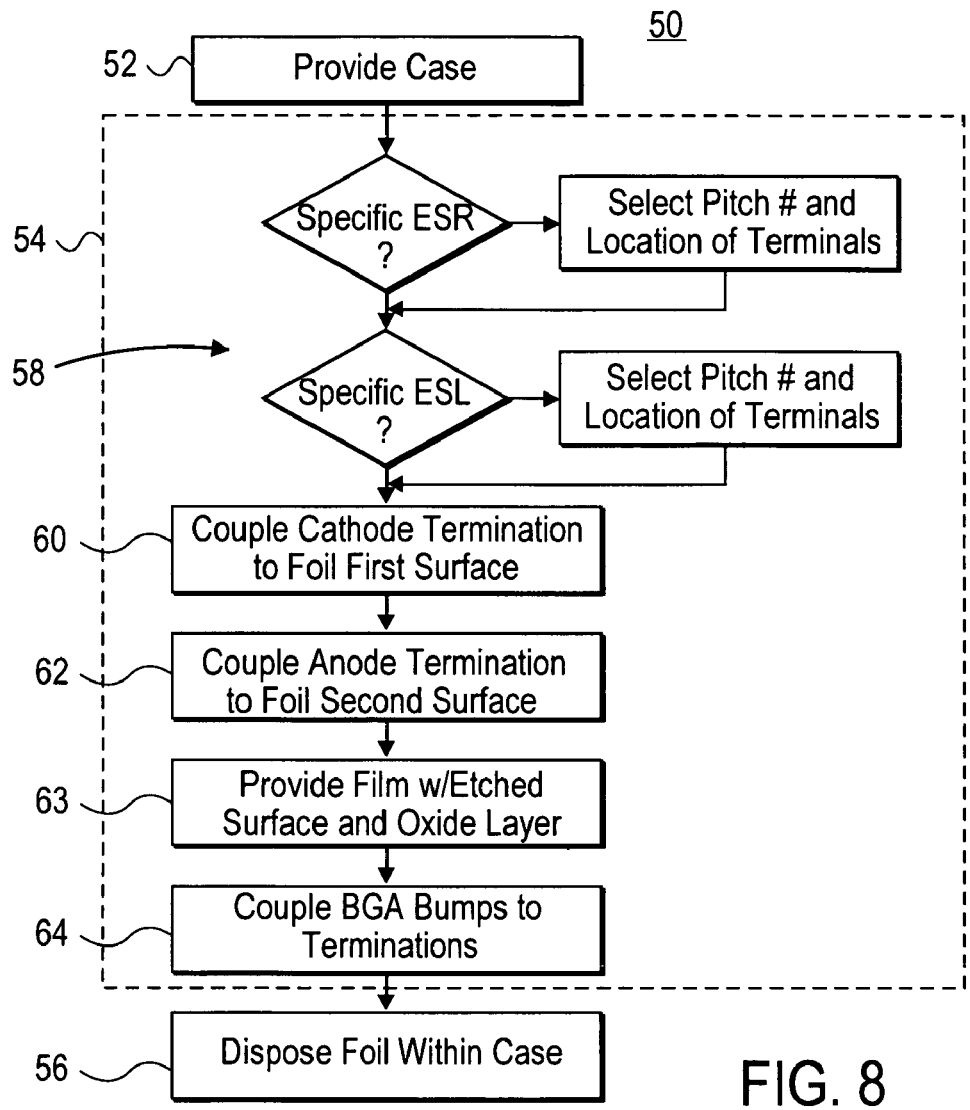
FIG. 8 is a flowchart of an example of a method of fabricating a capacitor in accordance with one embodiment of the present invention.

Turning now to FIG. 8, it will be appreciated that the present invention further provides a method 50 of fabricating a capacitor. Generally, a case is provided at processing block 52 and a ball-and-lead configuration is coupled to a foil at block 54. The foil is then disposed within the case at block 56 (after being wound) such that the lead configuration extends from the case. A first end of the cathode termination is coupled to a first surface of the foil at block 60. Block 62 provides for coupling of the first end of the anode termination to a second surface of the foil. A film with an etched surface and oxide layer is provided for at block 63 in order to achieve an appropriate dielectric layer. It should be noted that the resulting foil can be achieved through standard etching, oxidation, and alignment processes. It can further be seen that a plurality of solder balls are coupled to second ends of the terminations at block 64, where the solder balls enable electrical connection of the lead configuration to the PWB.

It will be appreciated that the order in which the processing blocks are performed may vary without departing from the nature and scope of the invention. For example, the solder balls may be coupled to the terminations before the terminations are coupled to the foil. It should also be noted that the solder balls enable surface mount connection of the lead configuration to the PWB.

Figure 9:
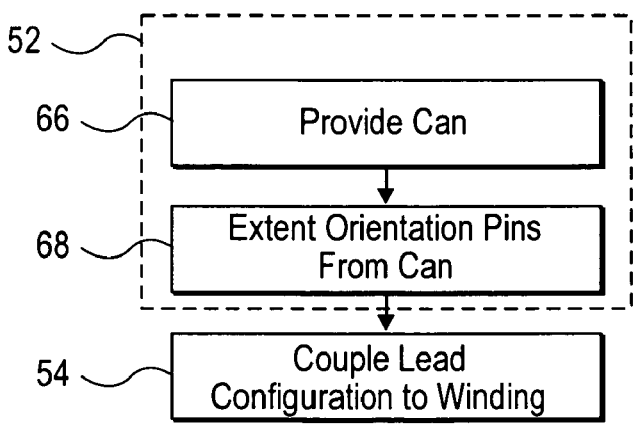
FIG. 9 is a flowchart of an example of a process of providing a case in accordance with one embodiment of the present invention.

Turning now to FIG. 9, one approach to providing a case for the capacitor is shown. Specifically, a can is provided at step 66, which enables the overall height of the capacitor to be significantly reduced. Block 68 provides for extending a plurality of orientation pins from the case, where the orientation pins facilitate assembly of the capacitor to a PWB. The orientation pins may be of any shape and number, and can be coupled to the can by any acceptable technique. For example, in the illustrated embodiment (FIG. 6), three orientation pins 46a, 46b, 46c, have a rectangular shape and are welded to an outer surface of the case 32. FIG. 5 shows that corresponding apertures are provided in the PWB 28 to facilitate alignment of the solder balls 42 with the corresponding set of pads on the upper surface of the PWB 28.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and following claims.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of making a surface mountable capacitor, comprising:
   attaching no more than five terminations to a foil, the no more than five terminations attached at a first end of each termination;
   attaching a solder ball to each termination, each solder ball attached at a second end of each termination enabling a surface mount connection;
   winding the foil;
   attaching alignment pins to a case such that the alignment pins extend from the case, the alignment pins to facilitate proper orientation during surface mounting; and
   inserting the foil into the case.

2. The method of claim 1, wherein the terminations include a single cathode termination and a single anode termination.

3. The method of claim 1, further comprising:
   mounting the solder balls to a PWB.

4. The method of claim 1, wherein the foil includes two conductive surfaces and a dielectric layer between the conductive surfaces.

* * * * *